United States Patent
Jäntti et al.

(10) Patent No.: US 7,061,409 B1
(45) Date of Patent: Jun. 13, 2006

(54) TECHNIQUES FOR SAMPLE RATE CONVERSION

(75) Inventors: Joni Jäntti, Oulu (FI); Antti Ruha, Oulu (FI)

(73) Assignee: Nokia Corporation, Espoo (FI)

(*) Notice: Subject to any disclaimer, the term of this patent is extended or adjusted under 35 U.S.C. 154(b) by 0 days.

(21) Appl. No.: 11/053,513

(22) Filed: Feb. 7, 2005

(51) Int. Cl.
*H03M 7/00* (2006.01)

(52) U.S. Cl. .......................... 341/61; 341/50

(58) Field of Classification Search ............ 341/61
See application file for complete search history.

(56) References Cited

U.S. PATENT DOCUMENTS 6,744,837 B1 * 6/2004 Satou et al. ............. 375/372
2005/0163276 A1 * 7/2005 Sudo et al. ............. 375/372

OTHER PUBLICATIONS

"Digital Methods for Conversion Between Arbitrary Sampling Frequencies", Tor A. Ramstad, IEEE Transactions on Acoustics, Speech, And Signal Processing, vol. ASSP-32, No. 3, Jun. 1984, pp. 577-591.

"An Efficient Approach For Conversion Between Arbitrary Sampling Frequencies", Tapio Saramäki et al., IEEE 1996, pp. 285-288, no month.

* cited by examiner

*Primary Examiner*—Rexford Barnie
*Assistant Examiner*—Joseph Lauture
(74) *Attorney, Agent, or Firm*—Harrington & Smith, LLP

(57) ABSTRACT

Techniques for sample rate conversion are disclosed. In one exemplary embodiment, a sample rate conversion occurs between first samples having a sample rate defined by a first clock signal and second samples having a sample rate defined by a second clock signal. Using a conversion ratio and at a first rate defined by the first clock signal, a given second sample is determined from at least one first sample. A write pointer is updated for a buffer when second samples are written into the buffer. A read pointer is updated for the buffer when second samples are read from the buffer. The second samples are read from the buffer at a second rate defined by the second clock signal. The conversion ratio is modified based on the write and read pointers.

35 Claims, 12 Drawing Sheets

TECHNIQUES FOR SAMPLE RATE CONVERSION

TECHNICAL FIELD

This invention relates generally to a digital system using two different clock signals and, more specifically, relates to sample rate conversion between first samples having a sample rate defined by a first clock signal in a first portion of the digital system and second samples having a sample rate defined by a second clock signal in second portion of the digital system.

BACKGROUND OF THE INVENTION

In some systems that use digital data, one portion of the digital system operates relative to a first clock signal while a second portion operates relative to a second clock signal. Typically, samples, which are sequences of bits sampled at times regulated by an associated clock signal, are to be passed between the first and second portions of the digital system. When frequencies of the first and second clock signals are different, sample rate conversion is used to convert samples having a sample rate defined by one clock signal into samples having a sample rate defined by another clock signal. One such sample rate conversion is called decimation, in which a decrease occurs in sample rate between portions (e.g., between the first and second portions) of the digital system.

Thus, decimation is used when a first clock frequency for the first portion is higher than a second clock frequency for the second portion, and when samples are to be passed from the first to the second portion. Decimation produces fewer samples at the second clock frequency, as compared to the number of samples at the first clock frequency. The process used to determine values for the second samples is usually interpolation. Interpolation typically involves both using values for first samples and a given conversion ratio in order to determine values for second samples.

Decimation using integer ratios (e.g., of the first and second clock frequencies or periods) is an everyday signal processing operation and can be performed without a decrease of signal-to-noise ratio (SNR), if all signal energy is below the new sampling frequency before the conversion. Also decimation using rational division of two integers can be also easily implemented by consecutive up-sampling and then down-sampling, but can be implemented with reasonable costs and good performance only for small integers. Irrational decimation is far more problematic, because there are no exact signal values available for each second sample and new second samples need to be interpolated between existing first samples.

While there are techniques to perform irrational decimation, many of these techniques have certain problems, e.g., an exact conversion ratio needs to be set beforehand. It would therefore be desirable to provide rate conversion techniques that overcome one or more of these problems.

BRIEF SUMMARY OF THE INVENTION

The foregoing and other problems are overcome, and other advantages are realized, in accordance with the presently preferred embodiments of these teachings. In particular, the present invention provides techniques for sample rate conversion. Such techniques can provide, for example, sample rate conversion suitable for use with rational and irrational conversion ratios, including decimation ratios.

These techniques may also include a new adaptive conversion ratio tracking method that provides support for arbitrary ratios, where a conversion ratio is determined from clock signals. These techniques may also include a sample rate converter that is an interface element, which can be used to connect two blocks having different and unrelated sample rates.

In an exemplary embodiment of the invention, a method is disclosed for sample rate conversion between first samples having a sample rate defined by a first clock signal and second samples having a sample rate defined by a second clock signal. The method comprises the following steps. Using a conversion ratio and at a first rate defined by the first clock signal, a given second sample is determined from at least one first sample. A write pointer for a buffer is updated when second samples are written into the buffer. A read pointer for the buffer is updated when second samples are read from the buffer. The second samples are read from the buffer at a second rate defined by the second clock signal. The conversion ratio is modified based on the write and read pointers.

In another exemplary embodiment, a sample rate converter is disclosed that provides sample rate conversion between first samples having a sample rate defined by a first clock signal and second samples having a sample rate defined by a second clock signal. The sample rate converter comprises a buffer. The sample rate converter further comprises an interpolator coupled to the buffer and to the first clock signal. The interpolator is adapted to determine, using a conversion ratio and at a first rate defined by the first clock signal, a given second sample from at least one first sample. The sample rate converter further comprises first logic coupled to the buffer. The first logic is adapted to update a write pointer when second samples are written into the buffer, and adapted to update a read pointer when second samples are read from the buffer. The second samples are read from the buffer at a second rate defined by the second clock signal. The sample rate converter also comprises second logic coupled to the first logic and the interpolator. The second logic is responsive to the write and read pointers and is adapted to modify the conversion ratio based on the write and read pointers.

In yet another exemplary embodiment, a mobile station is disclosed. The mobile station comprises a front end operating using a first clock signal, a back end operating using a second clock signal, and a sample rate converter coupling the front and back ends. The sample rate converter provides sample rate conversion between first samples having a sample rate defined by the first clock signal and second samples having a sample rate defined by the second clock signal, the sample rate converter. The sample rate converter comprises a buffer. The sample rate converter further comprises an interpolator coupled to the buffer and to the first clock signal. The interpolator is adapted to determine, using a conversion ratio and at a first rate defined by the first clock signal, a given second sample from at least one first sample. The sample rate converter further comprises first logic coupled to the buffer. The first logic is adapted to update a write pointer when second samples are written into the buffer, and adapted to update a read pointer when second samples are read from the buffer. The second samples are read from the buffer at a second rate defined by the second clock signal. The sample rate converter also comprises second logic coupled to the first logic and the interpolator. The second logic is responsive to the write and read pointers and is adapted to modify the conversion ratio based on the write and read pointers.

In an additional exemplary embodiment, a program product is disclosed that is embodied on a recordable medium. The program product is for sample rate conversion between first samples having a sample rate defined by a first clock signal and second samples having a sample rate defined by a second clock signal. The program product comprising one or more programs that perform the following steps. Using a conversion ratio and at a first rate defined by the first clock signal, a given second sample is determined from at least one first sample. A write pointer for a buffer is updated when second samples are written into the buffer. A read pointer for the buffer is updated when second samples are read from the buffer. The second samples are read from the buffer at a second rate defined by the second clock signal. The conversion ratio is modified based on the write and read pointers.

In a further exemplary embodiment, an apparatus is disclosed for sample rate conversion between first samples having a sample rate defined by a first clock signal and second samples having a sample rate defined by a second clock signal. The apparatus comprises means for determining, using a conversion ratio and at a first rate defined by the first clock signal, a given second sample from at least one first sample. The apparatus also comprises means for updating a write pointer for a buffer when second samples are written into the buffer and means for updating a read pointer for the buffer when second samples are read from the buffer. The second samples are read from the buffer at a second rate defined by the second clock signal. The apparatus additionally comprises means for modifying the conversion ratio based on the write and read pointers.

In yet another exemplary embodiment, a method is disclosed for sample rate conversion between first samples having a sample rate defined by a first clock signal and second samples having a sample rate defined by a second clock signal. The method comprises the following steps. Using a conversion ratio and at a first rate defined by the first clock signal, determining a given second sample from at least one first sample. The given second sample is written to a buffer. At a second rate defined by the second clock signal, one of the given second samples is read from the buffer. The steps of determining, writing, and reading are performed for a time period. It is determined how many given second samples were written into and read from the buffer in the time period. If necessary, conversion ratio is updated based on an amount of error between how many given second samples were written into and read from the buffer in the time period.

BRIEF DESCRIPTION OF THE DRAWINGS

The foregoing and other aspects of embodiments of this invention are made more evident in the following Detailed Description of Exemplary Embodiments, when read in conjunction with the attached Drawing Figures, wherein.

DETAILED DESCRIPTION OF EXEMPLARY EMBODIMENTS

As previously described, decimation is used when a first clock frequency for a first portion of a digital system is higher than a second clock frequency for the second portion of the digital system, and when samples are to be passed from the first to the second portion. Typically, a conversion ratio that defines a relationship between the first and second clock signals is used when determining second samples. The relationship is based on frequencies of the first and second clock signals. Thus, a conversion ratio of 2.0 means that the frequency of the first clock signal is twice the frequency of the second clock signal. The relationship, however, may be any based on other clock information such as period.

A use for sample rate conversion is typically in communications, where the digital system is a receiver, and there are at least two different use cases for rational and irrational decimation in a receiver. The first and most observable use case of sample rate conversion is to interface a common receiver front-end, such as a radio frequency (RF) integrated circuit, with a multi-system baseband application-specific integrated circuit (ASIC) that uses different system clock frequencies in a number of different modes (e.g., cellular modes). In this use, there are only some ratios that need to be supported.

Figure 1:
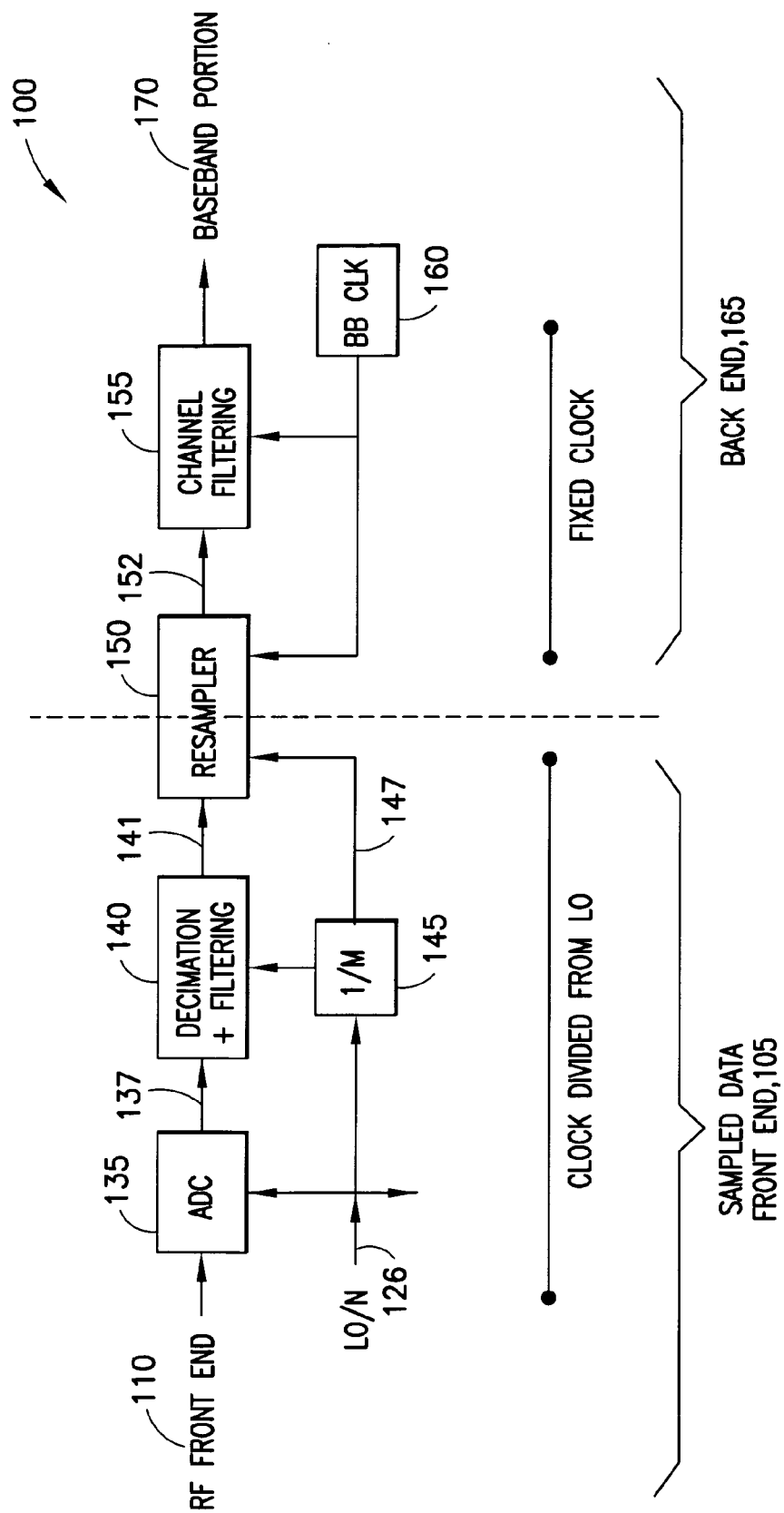
FIG. 1 is a block diagram of an exemplary receiver that uses a divided local oscillator signal as a sampling clock.

The second use case relates to the use of receiver 100, which uses a divided local oscillator as sampling clock, as shown in FIG. 1. The receiver 100 comprises a sampled data front end 105 and a back end 165. The sampled data front end 105 comprises an RF front end 110, a clock signal 126 determined by dividing a local oscillator (LO) by N, an analog-to-digital converter (ADC) 135, a decimation and filtering module 140, and a 1/M clock divider 145. The back end 165 comprises a channel filtering module 155, a baseband (BB) clock signal 160, and baseband portion 170.

The resampler 150 acts to interface the sampled data front end 105 and the back end 165. In the example of FIG. 1, a number of input samples 137 are created, and these samples are reduced through integer decimation in decimation and filtering module 140 to create intermediate samples 141. The intermediate samples 141 are then converted by the resampler 150 to create output samples 152.

The receiver 100 has a variable clock frequency derived from LO signals in order to have high quality clock signals (e.g., low phase noise) 126, 147. It is typical in this kind of receiver 100 that the sample rate of output samples 141 varies with the receiver 100 and channel to which the receiver 100 is tuned. By using sampled data, the receiver 100 has many advantages over conventional receivers, of which the following are examples: the receiver 100 generally uses switched capacitor (SC) techniques with excellent accuracy (e.g., no production trimming or calibration needed), cheaper semiconductor processes (e.g., no resistors), and better control on spurious signals over the RF band. In the case of FIG. 1, a purpose of sample rate conversion is to interface the sampled data front-end 105, operating with variable clock frequency determined by a LO and the clock divider 145, and the baseband portion 170, operating with a fixed clock frequency of the baseband clock signal 160. Further in the example of FIG. 1, so many conversion ratios need to be supported that fixed solutions cannot be used, and instead some type of adaptive irrational type of sample rate conversion is required.

Data from the ADC 135 needs to be processed before sample rate conversion can be done. First, data is down-converted (e.g., decimated) for filtering and sample rate conversion. In FIG. 1, the decimation and filtering module 140 performs a first decimation using integer decimation and filtering such that the number of input samples 137 is larger, per unit of time, than the number of intermediate samples 141. Then, the sample rate converter 150 performs an irrational decimation by using a decimation ratio (not shown in FIG. 1), which is a conversion ratio where the number of output samples (e.g., the output samples 152) is greater than the number of input samples (e.g., the intermediate samples 141). Illustratively, the relationship between the clock signal 147 and the baseband clock signal 160 is the frequency of the clock signal 147 is greater than the frequency of the baseband clock signal 160. The filtering performed in the decimation and filtering module 140 limits the signal bandwidth in order to avoid aliasing of high power interference signals in sample rate conversion.

Figure 2:
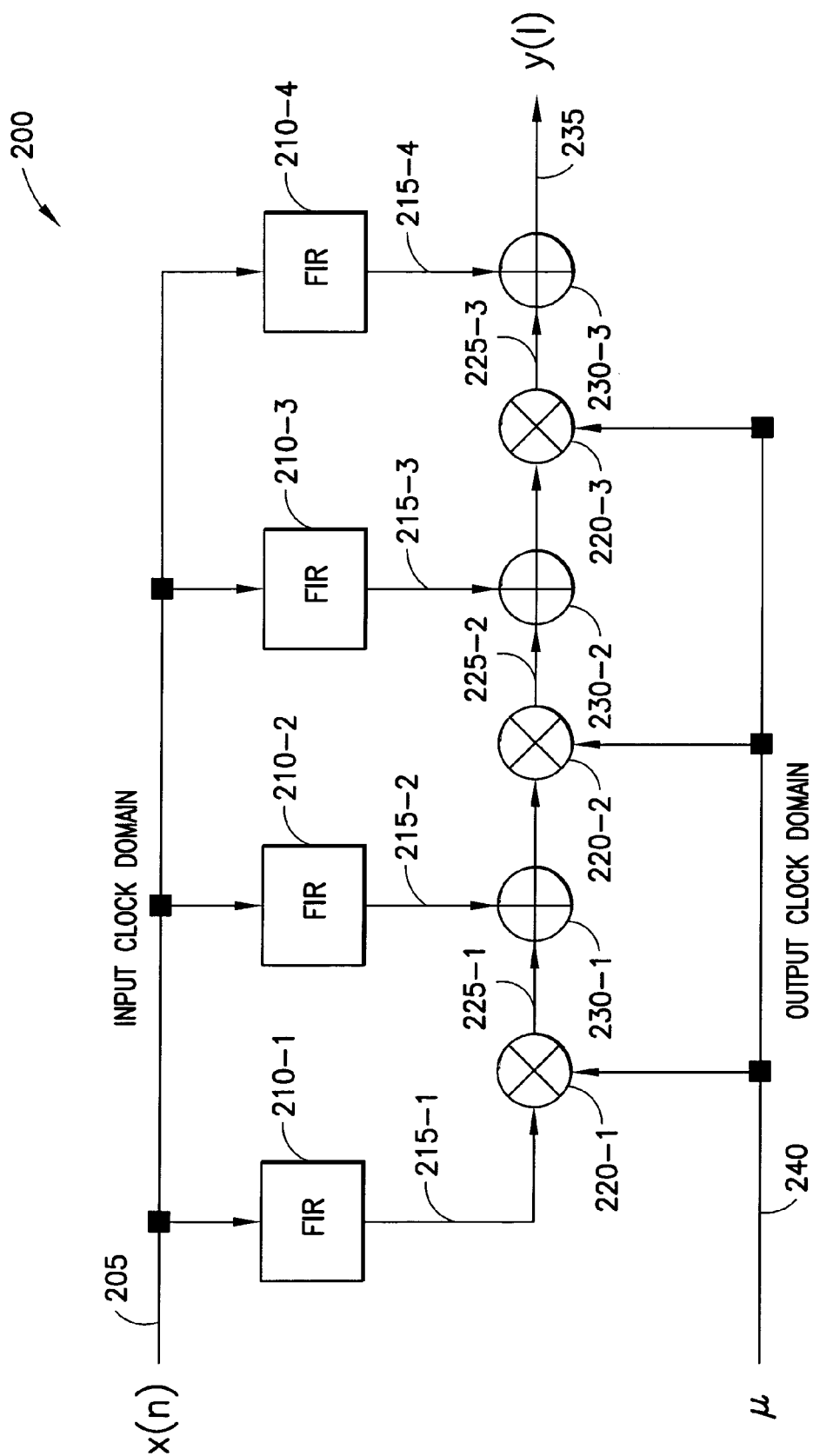
FIG. 2 is an exemplary block diagram of a so-called Farrow interpolator used in some digital systems for sample rate conversion.

When unwanted interferences are filtered, when anti-alias filtering is done properly, and when conversion ratio and clock signal phases are exactly evaluated, interpolation of new samples from input samples can be done using known structures (e.g., a Farrow structure, as shown in FIG. 2 for instance) with very low loss in SNR. Interpolation, in terms of FIG. 1, is performed in sample rate converter 150. In addition to this, fractional delay calculation for providing exact time points for interpolation needs to be solved accurately.

The implementation of variable irrational decimation ratios has some problems. For instance, the exact value of the decimation ratio or of clock signal phases may not be known or cannot be presented exactly, and the errors in actual decimation ratio cause cumulative error in fractional delay calculations and leads to errors in interpolation. The interpolation errors naturally cause a decrease in the SNR.

There are many possible interpolation methods for sample rate conversion. Widely used are at least linear, all-pass, third-order Lagrange and B-spline methods. The interpolation method is selected to fulfill requirements with minimal costs. For instance, linear and all-pass methods are used when input bandwidth is limited to and SNR requirements are easy. High-order Lagrange and B-spline methods are used to resample signals in noisy environments and produce as high SNR as possible. There are also optimization methods to further improve filtering characteristics of interpolators.

Figure 3:
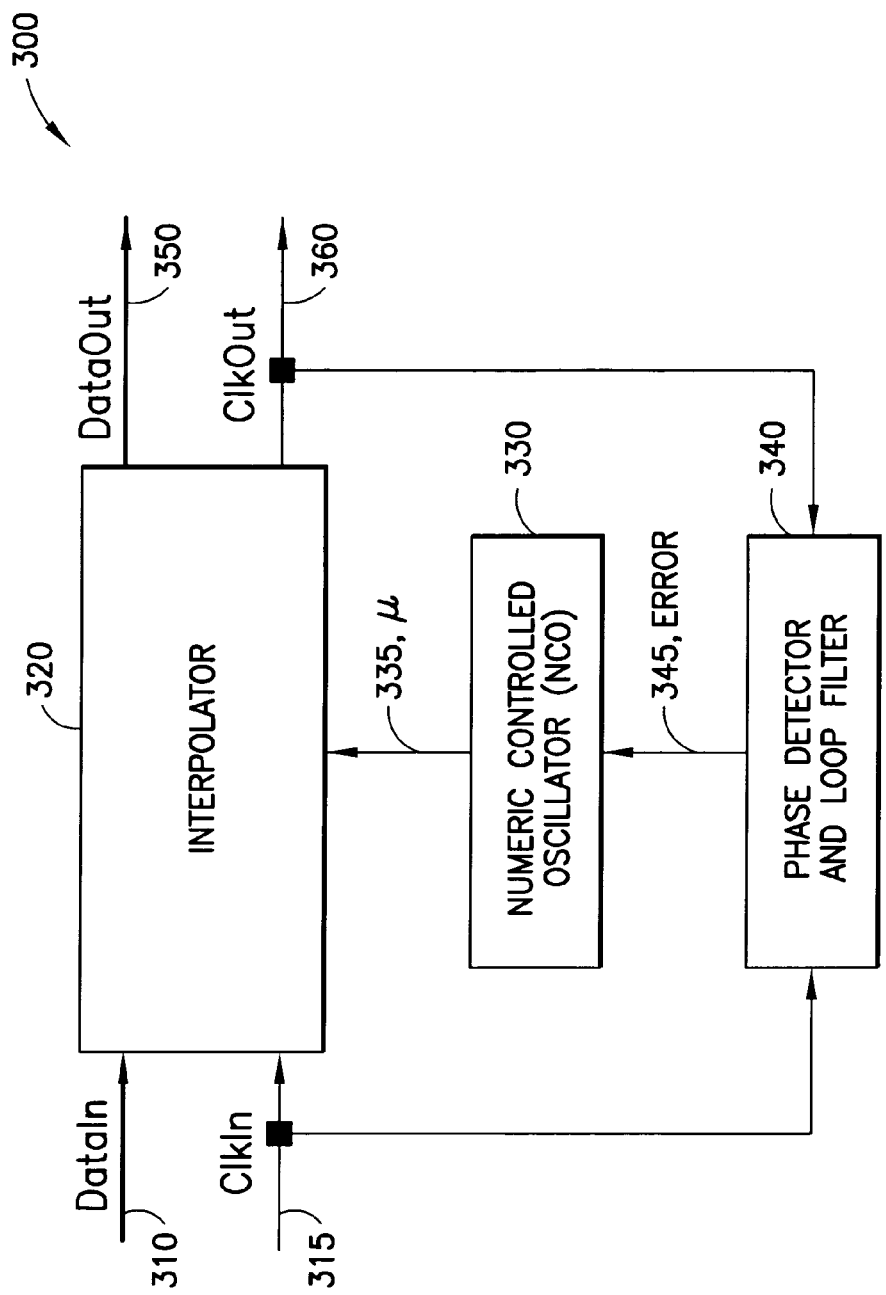
FIG. 3 is an exemplary block diagram of a sample rate converter used in certain digital systems.

The high-order interpolator for sample rate conversion is usually based on FIR-filter having polynomial-based impulse response. The impulse response is fitted for each sample on a certain point between two existing samples. Interpolation can be performed with FIR-filters having multiple coefficients stored in memory or much more efficiently using a so called Farrow structure, as shown in FIG. 2. FIG. 2 shows an exemplary block diagram of an interpolator 200 in the form of a Farrow structure. The interpolator 200 may be used in a sample rate converter as shown in FIG. 3. The interpolator 200 needs fractional delay information, μ, 240 for each interpolated sample. The interpolator 200 has FIR filters 210-1 through 210-4 having fixed coefficients (not shown) and fractional delay information, μ, 240 is added by multiplying the outputs of FIR-filters.

Specifically, an input sample, x(n), 205 is input to the FIR filters 210, which produce filtered data 215-1 through 215-4. The filtered data 215 is multiplied through multipliers 220-1 through 220-3 with the fractional delay information 240. The results 225-1 through 225-3 are then added using adders 230-1 through 230-3. The fractional delay information 240 is determined using a conversion ratio (not shown in FIG. 2). Output samples, y(l), 235 are created.

The input samples 205 and the FIR filters 210 operate at an input clock frequency. The output samples 205, multipliers 220, and adders 230 can be considered to operate at an output clock frequency, because a register (not shown) after each of these devices is triggered by using an output clock. The output samples 235 are therefore produced at the output clock frequency.

Implementation for linear interpolation is quite straightforward and a digital signal processor (DSP) can be easily programmed to implement linear interpolation for integer and rational conversion ratios. Nonetheless, the performance is not sufficient when SNR needs to be maintained high in a noisy environment. Furthermore, when using fractional decimation ratios, there are some synchronization problems between the two portions of the digital system using two different clock frequencies.

There are some conventional digital implementations for sample rate conversion. FIG. 3 illustrates one such approach, which can be considered to be one way of performing the functions of sample rate converter 150 of FIG. 1. The approach in FIG. 3 illustrates sample rate conversion at a general level, so FIG. 3 does not cover all variations available. Shown in FIG. 3 is a sample rate converter 300 comprising an interpolator 320, a numeric controlled oscillator (NCO) 330, and a phase detector and loop filter module 340. The interpolator 320 can be an interpolator such as that shown in FIG. 2.

The interpolator 320 takes samples on the input data signal, DataIn, 320 and produces samples on the output data signal, DataOut, 350 using interpolation. The phase loop detector and loop filter 340 produces an error signal 345 indicative of a relationship between the input clock signal, ClkIn, 315 and the output clock signal, ClkOut, 360. The error signal 345 is digital. The NCO 330 uses that information to determine the fractional delay information, μ, 335. The interpolator 320 then uses one or more samples from the input data signal 310, the input clock signal 315, the fractional delay information 330, and the output clock signal 360 to determine a sample on the output data signal 350.

There are certain restrictions with the sample rate converter 300 presented in FIG. 3. The main restriction is that the clock signals 315 and 360 need to be somehow related. The conversion ratio can be irrational and variable, but then another clock signal needs to be generated from either inside the sample rate converter 300 or in a separate block. In the sample rate converter 300, the second clock signal 360 is generated using the input clock signal 315 and known conversion ratio, which is used to determine the fractional delay information 335. The all-digital feedback loop design of the sample rate converter 300 is difficult because error correction is always quantized. Usually "bang—bang" phase detection is used in the phase detector and loop filter 340. In "bang—bang" phase detection, the error signal 345 has a correction term that is fixed to one or few values. This causes an increase in settling times, which is detrimental if accuracy is to be maintained at a high level.

Thus, while there are implementations that use irrational decimation ratios and the synchronization problems associated therewith, none of these offers possibilities for having and using sample rate conversion as an independent block (see FIG. 4), which can be connected between two interfaces with minimal design in order to enable interoperability.

Certain embodiments of the present invention describe, for instance, methods and apparatus for calculating conversion ratios and sample timings accurately and, further, a topology that overcomes implementation issues of asynchronous interface.

Figure 4:
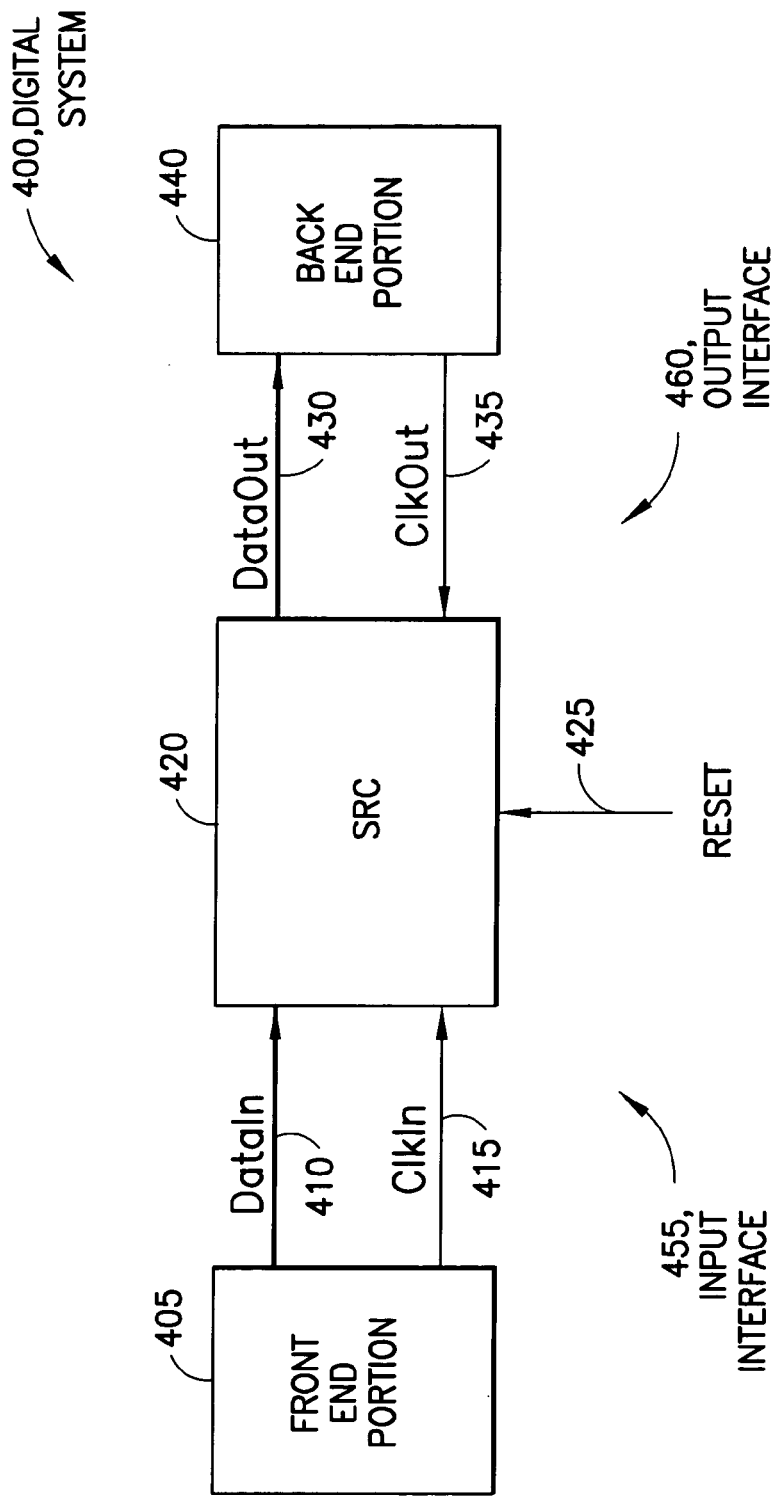
FIG. 4 is an exemplary block diagram illustrating a digital system comprising a sample rate converter, in accordance with an exemplary embodiment of the present invention.

Turning now to FIG. 4, a digital system 400 is shown. Digital system 400 will typically be a receiver, such as the receiver 100 shown in FIG. 1, but can be any system where data is transferred between portions of the digital system 100 that use different clock signals having different frequencies. Digital system 400 could be, for example, part of a mobile station that supports one or more cellular phone protocols. Digital system 400 comprises a front end portion 405, a sample rate converter (SRC) 420, and a back end portion 440. The front-end portion 405 operates using at least the input clock signal, ClkIn, 415 and samples on the input data signal. 410, DataIn, have a sample rate defined by the input clock signal 415. The back-end portion operates using at least the output clock signal, ClkOut, 535 and samples on the output data signal, DataOut, 430 have a sample rate defined by the output clock signal 435. The sample rate converter 420 performs sample rate conversion of samples on the input data signal 410 to samples on the output data signal 430. The sample rate conversion performed by the invented sample rate converter 420 uses the input clock signal 415 and input samples to determine samples on the output data signal 430. The determination is typically performed through interpolation, as described below.

Note that the output clock signal 435 is an input into the sample rate converter 420. This means that the back-end portion 440 can operate independently, in terms of clocks, from the front end portion 405. Additionally, the sample rate converter 420 will typically write, by using the output clock signal 435, samples to the output data signal 430 and therefore to the back end portion 440. This write is performed according to and using the output clock signal 435 (e.g., the write is performed at a rate defined by the output clock signal 435). However, if desired, the back end portion 440 can read samples, using the output data signal 430, from the sample rate converter 420. This read is performed according to and using the output clock signal 435.

The sample rate converter 420 can be considered to have an input interface 455 suitable for accepting the input data signal 410 and the input clock signal 415. The sample rate converter 420 also has an output interface 460 suitable for coupling the output data signal 430 to the back end portion 40 and for accepting the output clock signal 435.

The digital system 400 also has a reset 425 that is typically used during initial startup and whenever else reset of the sample rate converter 420 is desired. The reset 425 may be controlled, for instance, by control devices (not shown) that could be implemented as part of the front end portion 405, the back end portion 440, or another portion (not shown) of the digital system 400. After reset, it is also advantageous to give an initial value (not shown) for a conversion ratio (e.g., for each digital system such as a global system for mobile communications, GSM, and wideband code-division multiple access, WCDMA, digital systems) to speed up the settling of the sample rate converter 420.

Figure 5:
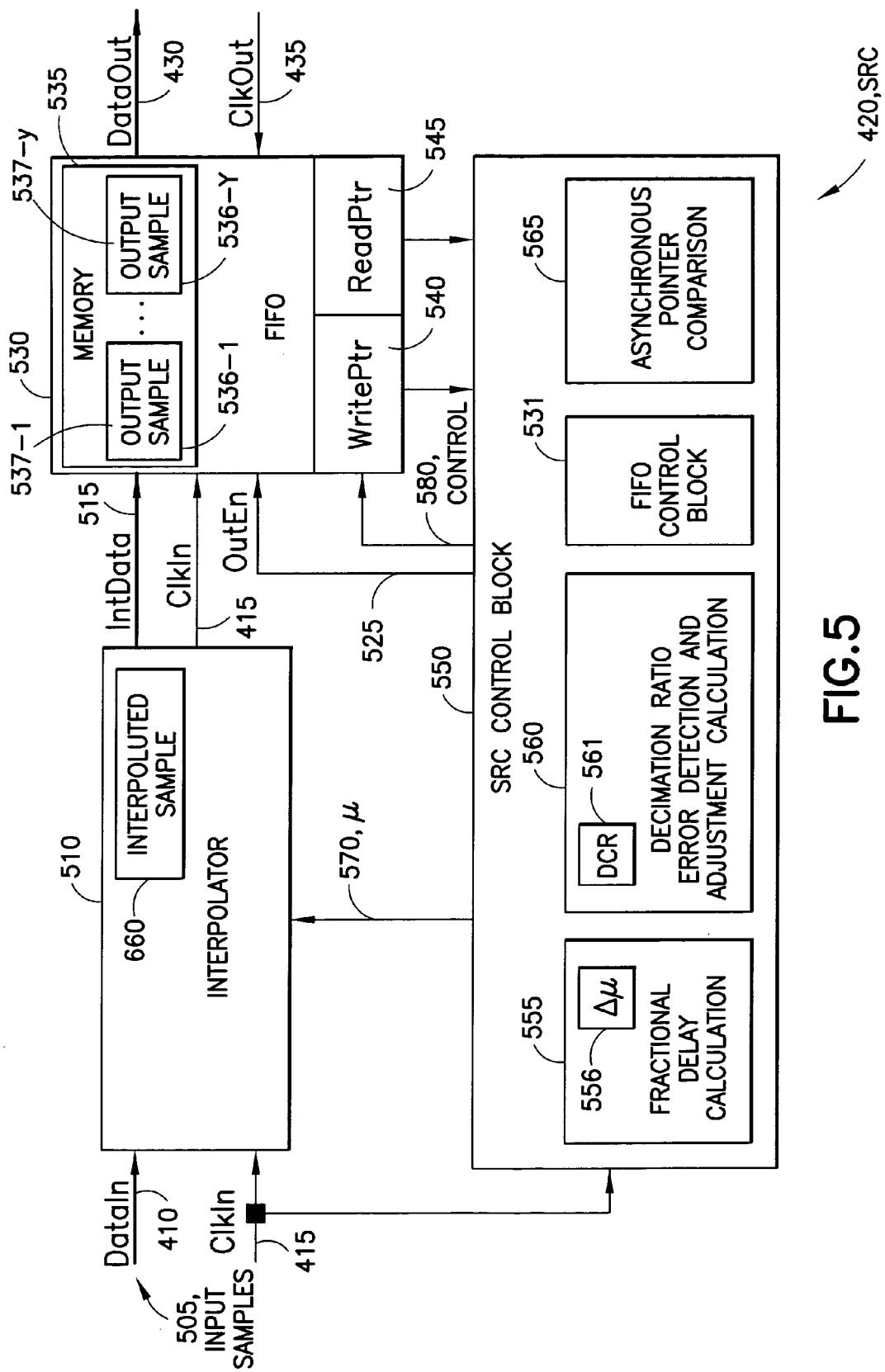
FIG. 5 is an exemplary block diagram of the sample rate converter shown in FIG. 4.

Referring now to FIG. 5, an example of a sample rate converter 420 is shown. The sample rate converter 420 comprises an interpolator 510, a first in, first out (FIFO) buffer 530, and an SRC control block 550. The FIFO 530 and the SRC control block 550 can be considered to be a feedback loop. The FIFO 530 is a buffer comprising a write pointer 540, a read pointer 545, and a memory 535. The memory 535 has memory locations 536-1 through 536-$y$, each of which contains an output sample 537 in this example. The write pointer 540 points to the next memory location 536 into which the next output sample 537 should be placed, and the read pointer 545 points to the next memory location 536 from which the next memory sample 537 should be read.

The SRC control block 550 has logic comprising a module 555 that performs fractional delay calculations, a module 560 that performs decimation ratio error detection and adjustment calculations, a module 565 that performs asynchronous pointer comparison, and a FIFO control block 531. The SRC control block 550 produces a control signal 580, fractional delay information, $\mu$, 570, and an enable signal, OutEn, 525. The SRC control block 550 has inputs of the input clock signal 415, the write pointer 540, and the read pointer 545, reset (shown in FIG. 4 but not shown in FIG. 5) and an initial guess (not shown) for the decimation ratio (DCR) 561. The FIFO 530 has inputs of an interpolator data signal 515, the input clock signal 415, the enable signal 525, the output clock signal 435, and the control signal 580. The FIFO control block 531 controls, using control signal 580 and the enable signal 525, the operations (e.g., reading to or writing from the memory 535, updating and resetting the write pointer 540 and the read pointer 545) performed by the FIFO 530. In an exemplary embodiment, the FIFO 530 produces output samples 537 on the output data signal 430.

Although the description herein pertains to a decimation ratio, the present invention may be used for any conversion ratio, such as a conversion ratio used to increase the sampling rate (e.g., up-sampling) from an initial rate.

Figure 6:
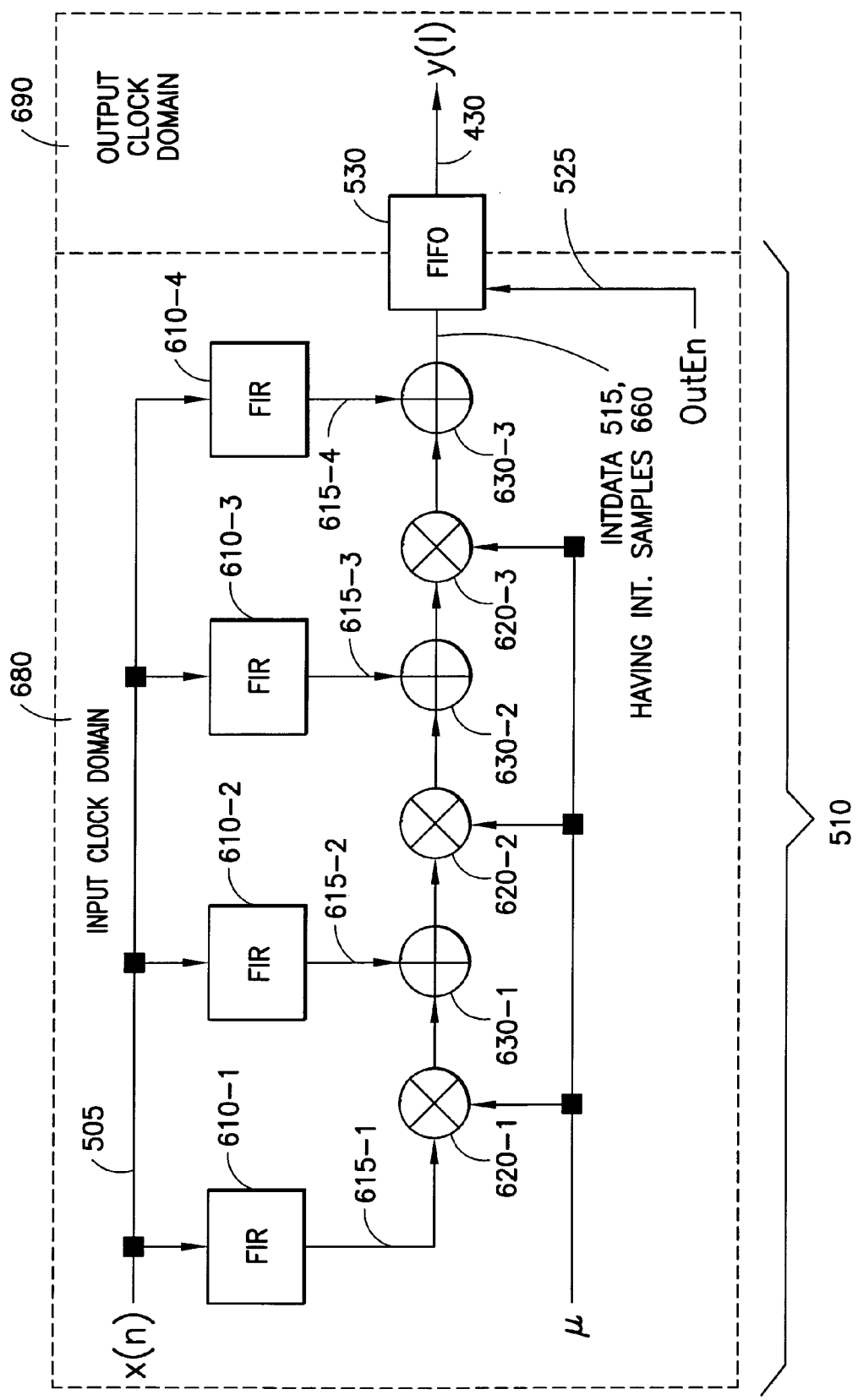
FIG. 6 is an exemplary block diagram of an interpolator interfacing with a FIFO in the sample rate converter of FIG. 5.

Broadly, the interpolator 510 uses the fractional delay information 570 and one or more input samples 505 on the input data signal 410 to determine an interpolated sample 660 (see FIG. 6). In an exemplary embodiment, there are a number of interpolated samples 660, of which only some are to be output samples 537. The interpolator 510 produces interpolated samples 660 from input samples 505, and with the enable signal 525, valid output samples 537 are selected by the FIFO 530. The enable signal, OutEn, 525 is generated by the FIFO control block 531 using the decimation ratio 561. For instance, if the decimation ratio 561 is 2, every second interpolated sample 660 is discarded; if the decimation ratio 561 is 1.5, every third interpolated sample 660 is discarded. A method for determining when the enable signal, OutEn, 525 is enabled is shown in FIG. 13 and described below.

The interpolator 510 communicates interpolated samples 660 using the interpolator data signal 515 and also passes the input clock signal 415 to the FIFO 530. The FIFO control block 531 has logic that controls the operation of the FIFO 530. As described below in reference to FIG. 9, the FIFO control block 531, based on the input clock signal 415 and output enable signal 525, will accept certain of the interpolated samples 660 as an output sample 537. It should be noted that some or all of the operations of the FIFO control block 531 could be placed in locations other than the SRC control block 550. For instance, the interpolator 510 could comprise logic to write an output sample to the memory FIFO 530.

Both interpolation operations and writing operations to the memory 535 occur at a rate that is defined by the input clock signal 415. For instance, interpolation and writing operations at a rate based on every rising (or falling) clock edge of the input clock signal 415, on every other rising (or falling) clock edge of the input clock signal 415, or on every rising and falling clock edge of the input clock signal 415. As described in more detail below, typically when down-converting, interpolation is performed at a faster rate than is writing; however, the rate for interpolation is defined by the rate of the input clock signal 415 and the rate for writing is defined by the rate of the input clock signal 415 as modified by the enable signal, OutEn, 525.

The output samples 537 are read from the memory 535 (e.g., and output on the output data signal 430) at a rate defined by the output clock signal 435. For instance, reading could occur based on every rising (or falling) clock edge of the output clock signal 435, on every other rising (or falling) clock edge of the output clock signal 435, or on every rising and falling clock edge of the output clock signal 435. Reading of the output sample 537 may be performed by the FIFO control block 531 reading the output sample 537 from the memory 535 and driving the output sample 537 onto the output data signal 430. Alternatively, a component (not shown) in the back end portion 440 (see FIG. 4) could read an output sample 537 from the memory 535 and the actual performance of reading operations could be performed by a component that is not the FIFO control block 531.

Figure 11:
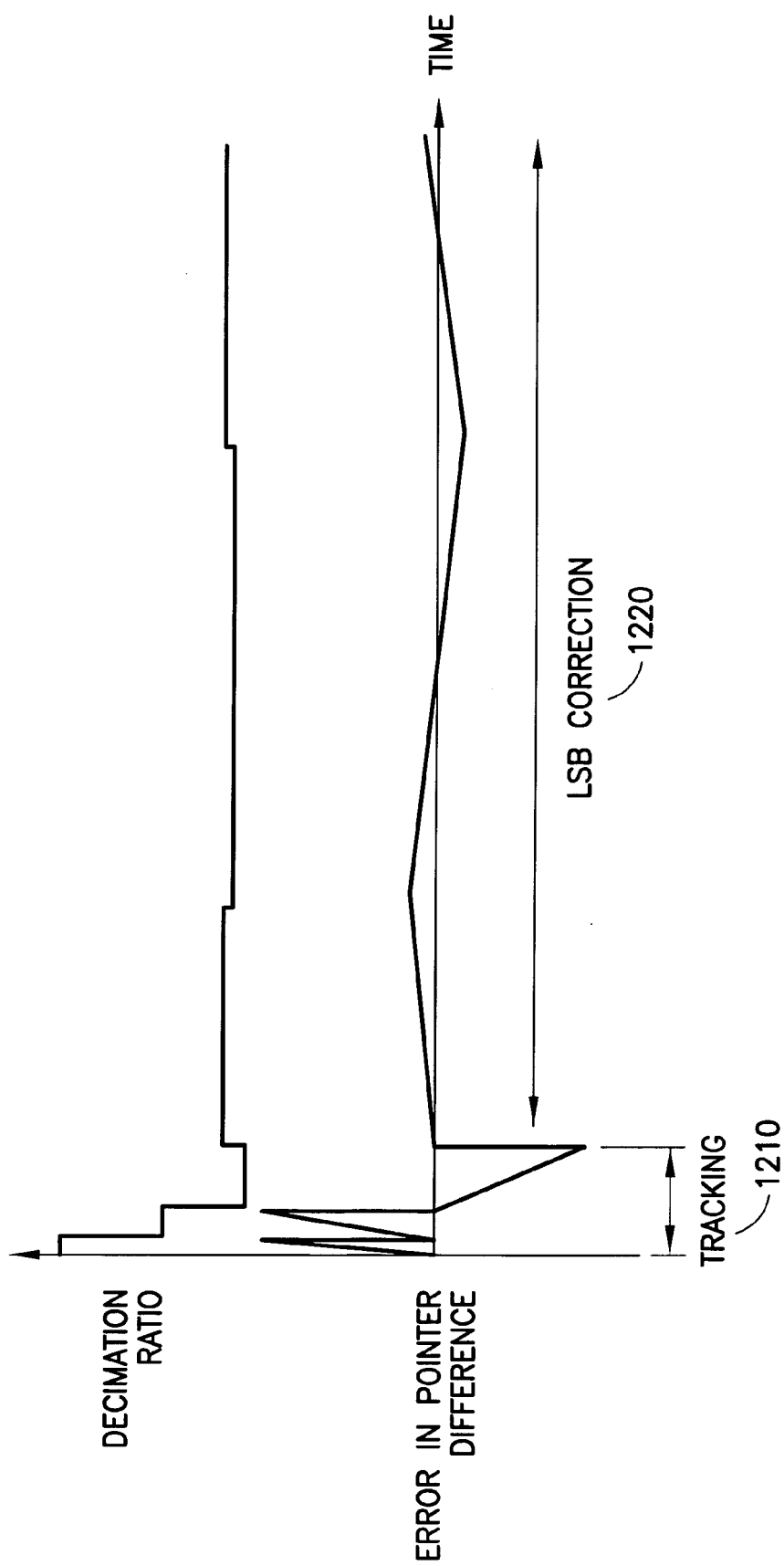
FIG. 11 shows a possible graph of decimation ratio during tracking and error in pointer difference as might be experienced by a sample rate converter using the method of FIG. 10.

The module 565 performs a comparison of the write pointer 540 and the read pointer 545. The module 560 uses an initial guess for the decimation ratio 561 and subsequently determines, using data from module 565 and in an exemplary embodiment, how many output samples 537 have been written to the memory 535 and read from the memory 535 over a certain time period. The latter determination provides an indication as to whether the decimation ratio 561 (e.g., and the fractional delay information 570, which is determined from the decimation ratio 561) is correct. If so, during the certain time period, then the number of output samples 537 written to the memory 535 should be the same as the number of output samples 537 read from the memory 530. If there are more or fewer output samples 537 being written to the memory 535 than read from the memory 537, the decimation ratio 561 should be changed. The module 560 performs a decimation ratio error detection and adjustment calculation to update the decimation ratio 561. An exemplary method for decimation ratio tracking is shown in FIG. 11. In an exemplary embodiment, under certain conditions, a least significant bit (LSB) adjustment to the decimation ratio 561 is performed to update the decimation ratio 561 without modifying the write pointer 540 and read pointer 545. Under other conditions, the decimation ratio 561 is updated by recalculating the decimation ratio 561. The control block 560 will typically also modify the write pointer 540 and read pointer 545 in response to recalculation of the decimation ratio 561 and as explained in additional detail below.

In response to updating the decimation ratio 561, the module 555 uses the new decimation ratio 561 to calculate a fractional delay factor, $\Delta\mu$, 556 for each new interpolated sample 660. Using the fractional delay factor, $\Delta\mu$, 556, the fractional delay information 570 can be determined. This is explained in more detail below.

Figure 7:
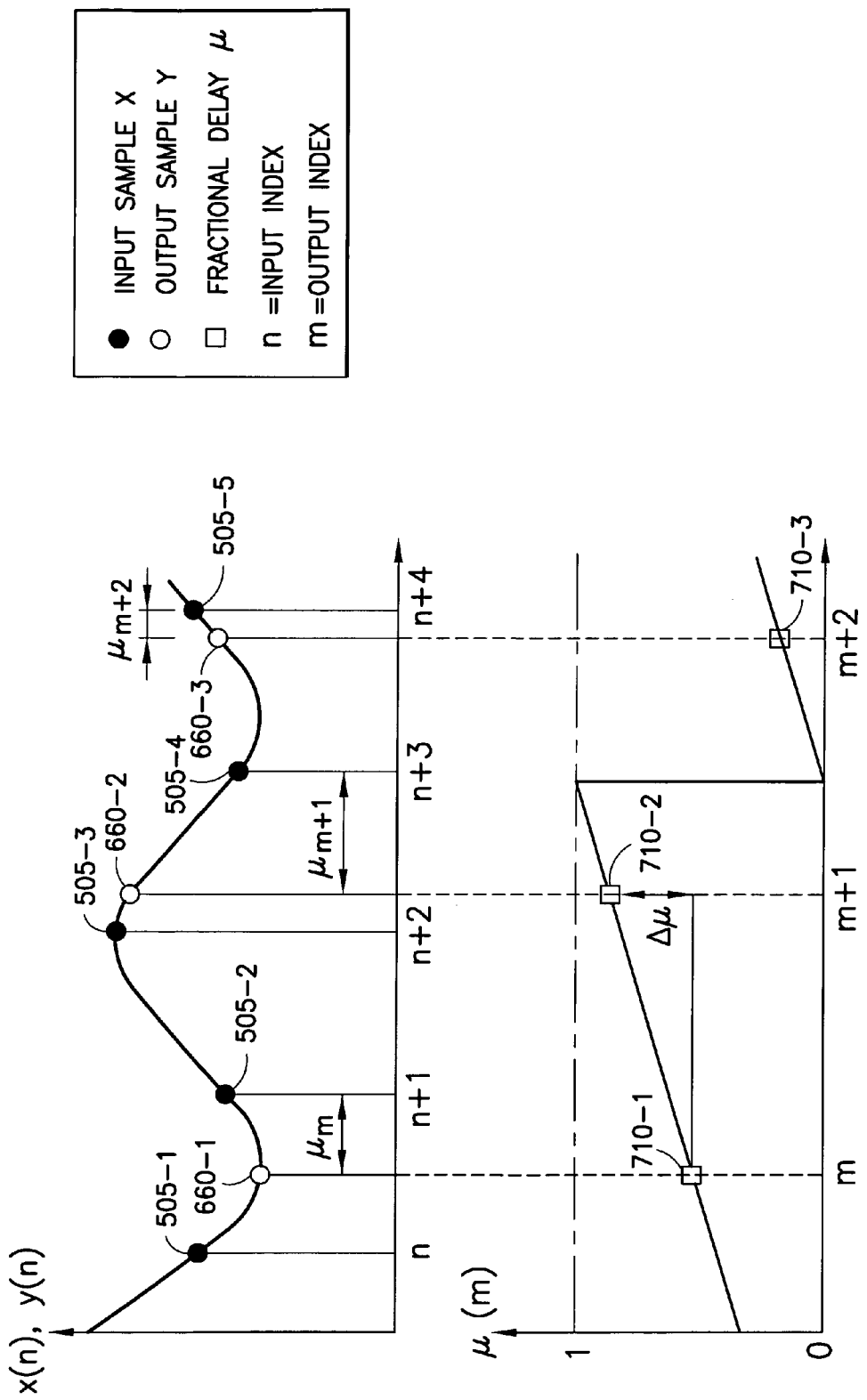
FIG. 7 shows two graphs used to illustrate how fractional delay is defined in Farrow interpolator having a clocking scheme performed in accordance with an exemplary embodiment of the present invention.
Figure 8:
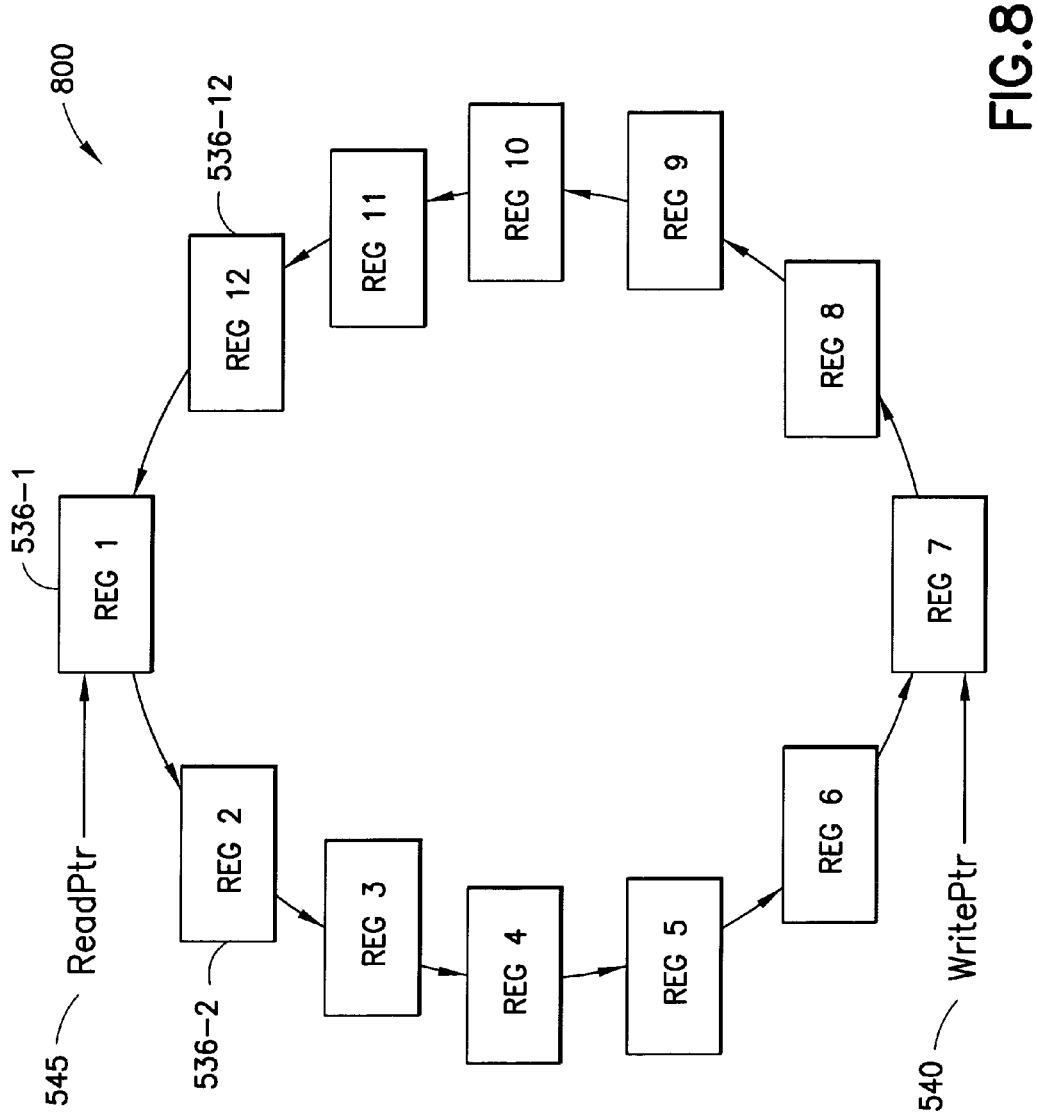
FIG. 8 is a block diagram of a representation of a first-in, first-out (FIFO) buffer from the sample rate converter of FIG. 5.

In an exemplary embodiment, memory locations 536 in the FIFO 530 comprise a circular buffer (as shown in FIG. 8). In a circular buffer, a pointer starts by pointing (e.g., referencing) to an initial memory location, increments (e.g., or decrements) with each write to (or read from) the memory, and is reset to point to the initial memory location once a predetermined, typically final memory location is reached. When the memory locations 536 are treated as a circular buffer, if either of pointers 540, 545 is going to catch the other pointer 540, 545, the decimation ratio 561 is corrected and pointers 540, 545 are set to starting positions (e.g., by using the control signal 580 of FIG. 5). This is explained in more detail in reference to FIG. 7. A correction term for decimation ratio 561 is calculated using amount of error and time it took to get to the error. In an ideal case, the correction needs only to be done once for each change in frequency, but real world effects like finite word lengths causes multiple corrections. This is explained in more detail in reference to FIG. 11. The number of corrections depends more on the accuracy of calculation than how far the decimation ratio 561 is from correct ratio.

Compared to a traditional PLL design, as shown in FIG. 3, the topology of FIG. 5 is "memoryless" (e.g., as there is no integrating term used for feedback) and so much easier to design. In an exemplary embodiment, each time an adjustment is performed to the decimation ratio 561, the feedback loop is reinitialized. In an exemplary embodiment, the sample rate converter 420 has a feedback loop (comprising, e.g., the FIFO 530, the SRC control block 420, and the interpolator 510), which has contribution from input samples 505 that are interpolated only to the previous time the decimation ratio 561 was modified.

It should be noted that the sample rate converter 420 can implemented in any number of ways. The sample rate converter 420 (or portions thereof) may be implemented by a DSP or other processor, hardware elements (e.g., such as a semiconductor circuit or discrete semiconductor packages), firmware elements (such as hardware that is configured through read-only memory), or some combination of these. Some or all of the invention may be implemented as a program product embodied on a recordable medium, where the program product comprises one or more programs suitable for performing steps to implement the present invention.

For FIGS. 6 through 11, reference to FIG. 5 is beneficial.

Turning now to FIG. 6, an example of an interpolator 510 interfacing with a FIFO 530 is shown. Interpolator 510 comprises FIR filters 610-1 through 610-4 having fixed coefficients (not shown), multipliers 620-1 through 620-3, and adders 630-1 through 630-3. Although four FIR filters 610 are shown, more or less of the FIR filters 610 may be used. An input sample, x(n), 505 is input to the FIR filters 610, which produce filtered data 615-1 through 615-4. The filtered data 615 is multiplied through multipliers 620-1 through 620-3 with the fractional delay information 570. The results 625-1 through 625-3 are then added using adders 630-1 through 630-3. The fractional delay information 640 is determined using a decimation ratio. Interpolated samples 660 are created and are output to the FIFO 530 using the interpolator data signal 515.

In the Farrow structure shown in FIG. 2, FIR filters 210 are clocked with an input clock signal and rest of the interpolation uses an output clock signal. For making digital implementation simpler, an exemplary embodiment of the present invention repartitions the input and output clock domains into clock domains 680 and 690. The repartitioning causes the actual interpolation to be done synchronously and there is only one clearly defined asynchronous interface, a FIFO 530 responsive to the enable signal, OutEn, 525.

In an exemplary embodiment, the interpolated samples 660 are then handled with a well-known FIFO module 530, where an asynchronous operation is pointer comparison. In the interpolator 510 of FIG. 6, the enable signal 525 (e.g., generated in the SRC control block 550 of FIG. 5) causes the FIFO 530 to latch in a new interpolated sample 660.

Turning now to FIG. 7, this figure shows two graphs used to illustrate how fractional delay is defined in a Farrow interpolator having a clocking scheme performed in accordance with an exemplary embodiment of the present invention. FIG. 7 also illustrates one example of how fractional delay information, μ, 570 is defined in interpolation. The darkened symbols in FIG. 7 mark input samples 505, the round empty symbols mark interpolated samples 660, which need to be interpolated using one or more input samples, and the square empty symbols mark values 710 (for fractional delay information 570) used to determine a fractional delay factor. Values 710 for fractional delay information 570 define how far away from latest input sample 505-2 a new interpolated sample 660 needs to be interpolated. Fractional delay information 570 can have values between zero and one so that, for instance, zero means that the next interpolated sample 660 is the same as a current input sample 505, 0.5 means that a new interpolated sample 660 needs to interpolated exactly between two previous input samples 505, and one means that a new interpolated sample 660 is the previous input sample 505. In FIG. 7, the ratio between input and output periods (e.g., defined as output period divided by input period) is approximately 1.7, so the decimation ratio (DCR) is the same approximate figure of 1.7. This means that a sample rate converter (e.g., sample rate converter 420) decimates input samples 505 so that an interpolated sample 660 is not interpolated after every input sample 505.

New fractional delay values 570 may be calculated (e.g., by the module 555) for every interpolated sample 660 and the fractional delay information 570 as function of interpolated samples 660 forms the curve illustrated in the bottom half of FIG. 7, having values 710-1 through 710-3 for fractional delay information 570 in this example. Recall that $\Delta\mu$ is the fractional delay factor 556, which is calculated by the module 555 using values of decimation ratio 561 provided by the module 560. The slope of curve in the bottom half of FIG. 7 is $\Delta\mu$/output sample, in which $\Delta\mu$=ceil(DCR)−DCR. Ceil is a mathematical function giving the smallest integer that is bigger than given irrational number. It should be noted that the decimation ratio 561 (e.g., instead of the fractional delay information 570) could be communicated to the interpolator 510, and the interpolator 510 could perform the determination of fractional delay information, μ.

In an exemplary embodiment, the asynchronous FIFO 530 comprises a number of registers. As shown in FIG. 8, the memory locations 536 may be implemented as multiple registers, which comprise a circular buffer 800. Although writing and reading occur at different rates defined by separate clocks, interpolated samples 660 (e.g., stored in memory locations 536) can be successfully transferred, if the write pointer 540 and read pointer 545 remain different and do not pass one another (e.g., never become the same). The write pointer 540 and read pointer 545 are initially set to be as far as possible from each other in the circular buffer 800, as shown in FIG. 8. Every time a new interpolated sample 660 is written to the circular buffer 800 (thereby becoming an output sample 537) or an output sample 537 is read from the circular buffer 800, the corresponding pointer 540, 545 is incremented (e.g., or decremented). When the last memory location (e.g., memory location 536-12 in the example of FIG. 8) is reached, the pointer is next set to point the first memory location (e.g., memory location 536-1).

Figure 9:
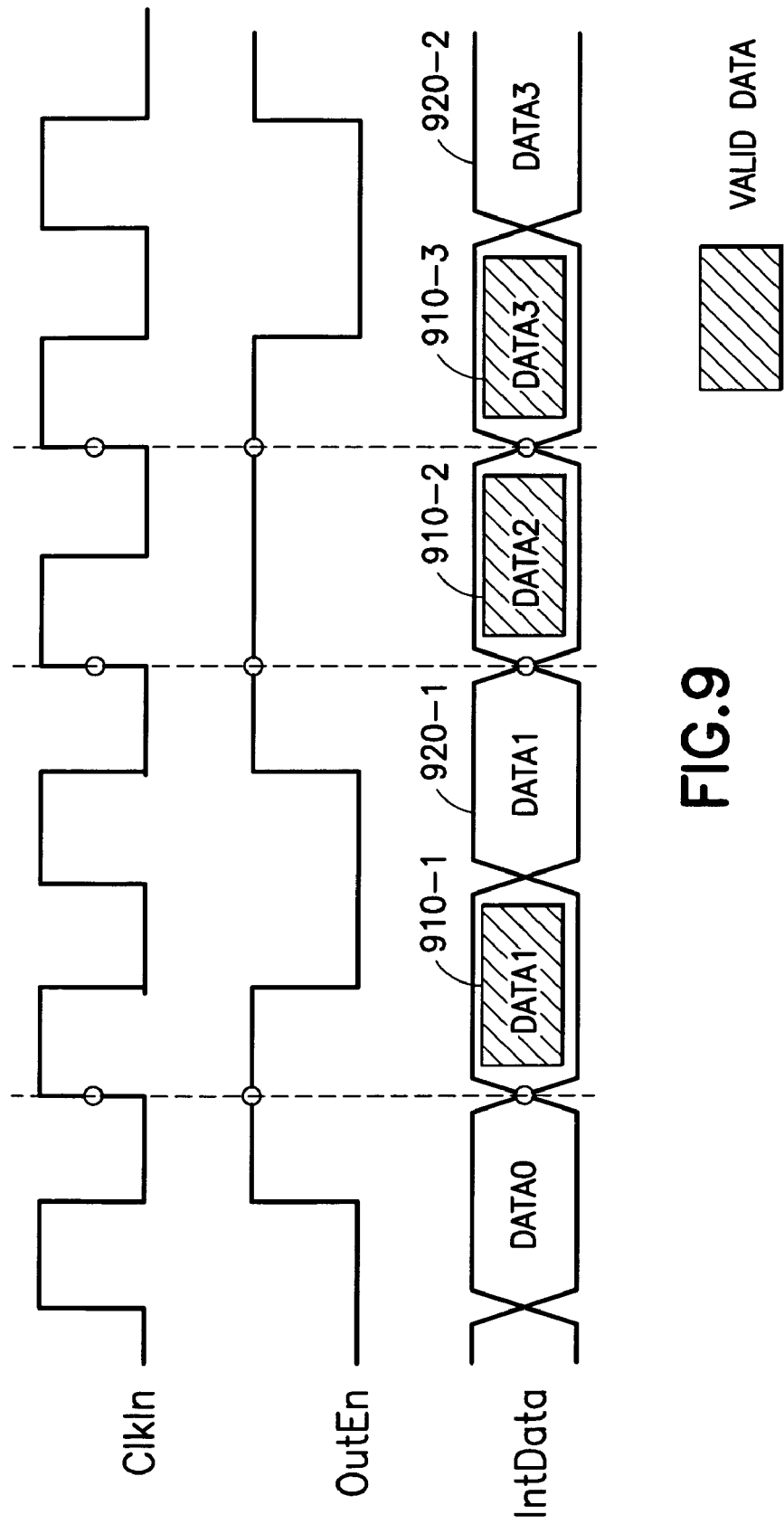
FIG. 9 shows timing diagrams for an input interface of the FIFO buffer of FIG. 8.

In FIG. 9, there are illustrated signals between the interpolator 510 and the FIFO 530. The ClkIn is the input clock signal 415, IntData contains interpolated samples 660 on the interpolator data signal 515, and OutEn expresses what interpolated samples 660 are valid (data 910-1 through 910-3) and what are just replicas (data 920-1 through 920-2) of previous interpolated samples 660. In an exemplary embodiment, the interpolated samples 660 are written to the memory 535 of the FIFO 530 at the rising edge of input clock signal if OutEn is high at that moment. In this exemplary embodiment, valid data samples 910 in FIG. 9 are marked with grey background shown in FIG. 9. The OutEn is changed at falling edge of the input clock signal 415, but is also changed at the rising edge of the input clock signal 415.

As can be seen in FIG. 9, interpolated samples 660 may not written to the memory 535 of the FIFO 530 at the same momentary rate as being read. On average, interpolated samples 660 are still written to FIFO 530 at the same speed as read, if decimation ratio 561 is exactly set. If decimation ratio 561 is not exactly correct, the number of written samples during specific time periods differs from the amount of read samples. If the current decimation ratio 561 is too small, the interpolator 510 generates more interpolated samples 660 than are needed (e.g., to be read from the FIFO 530) and the write pointer 540 starts to catch the read pointer 545. Secondly, if the current decimation ratio 561 is too big, the interpolator 510 generates fewer interpolated samples 660 than needed (e.g., to be read from the FIFO 530) and the read pointer 545 start to catch the write pointer 540. So, error in decimation ratio 561 can be detected from a difference between the pointers 540 and 545.

Traditional PLL feedback loops integrate the error to zero by multiple corrections, while the invented sample rate converter 420 is based on, in one exemplary embodiment, accurate correction term calculations without integration.

One solution for a feedback loop of a sample converter is the following (e.g., and as shown in FIG. 5). An integrating feedback loop is problematic here, because an error in conversion ratio can not be provided in real time and absolute stability is difficult to obtain. The error in pointer difference only provides an average of error in conversion ratio. In an exemplary sample rate converter of the present invention, this is solved using a "memoryless" feedback loop (e.g., comprising the FIFO 530 and the SRC control block 550) to provide absolute stability and fast settling. In traditional PLLs, frequency is changed gradually until the phase error is cancelled. In an exemplary embodiment herein, by contrast, a correction word for decimation ratio which is derivative of the pointer difference error, is calculated using error (e.g., as embodied in the pointers 540, 545) and consumed time. In other words, adjusting the decimation ratio 561 in the present invention can be considered to be an adjustment of "frequency" of an imaginary feedback loop. In contrary to an integrating feedback loop, "phase" of an imaginary feedback loop is also adjusted, in an exemplary embodiment, simultaneously with the "frequency" adjustment, instead of waiting for frequency correction to do the "phase" adjustment. The "phase" adjustment means in practice the resetting of the pointers 540, 545 after adjustment to the decimation ratio ("frequency") 561. It should be noted that the terms "phase" and "frequency" as these relate to resetting pointers 540, 545 and modification of the decimation ratio 561 are for exposition and to aid understanding of the invention and are not meant to be limiting in any way.

The "phase" and "frequency" correction scheme of FIG. 5 can cause discontinuities in the sampled signal (e.g., output data signal 430), because shifting of one of the pointers 540, 545 causes some interpolated samples to be discarded or repeated. In an ideal case, clock signals (such as the input clock signal 415 and the output clock signal 435) are stable and complete accuracy can be achieved in calculation, so the correction to the decimation ratio 561 only needs to be done once. In a real-world, finite word lengths and possible clock signal settling during the correction causes multiple corrections. This means that a certain tracking time should be provided for a sample rate converter 420 in start-up and when the frequency of either clock is changed. Finite word lengths also mean that an exactly correct decimation ratio 561 typically cannot be set. When error of decimation ratio is smaller than a least significant bit (LSB) of a correction word, the error cannot be corrected. This means that LSB correction to decimation ratio 561 should alter the decimation ratio 561 around the right value, and the sample rate converter 420 typically tries LSB correction to the decimation ratio 561 before "phase" and "frequency" correction (e.g., by recalculating the decimation ratio 561 and resetting the pointers 440, 445), which provides a larger than an LSB correction to the decimation ratio 561.

Figure 10:
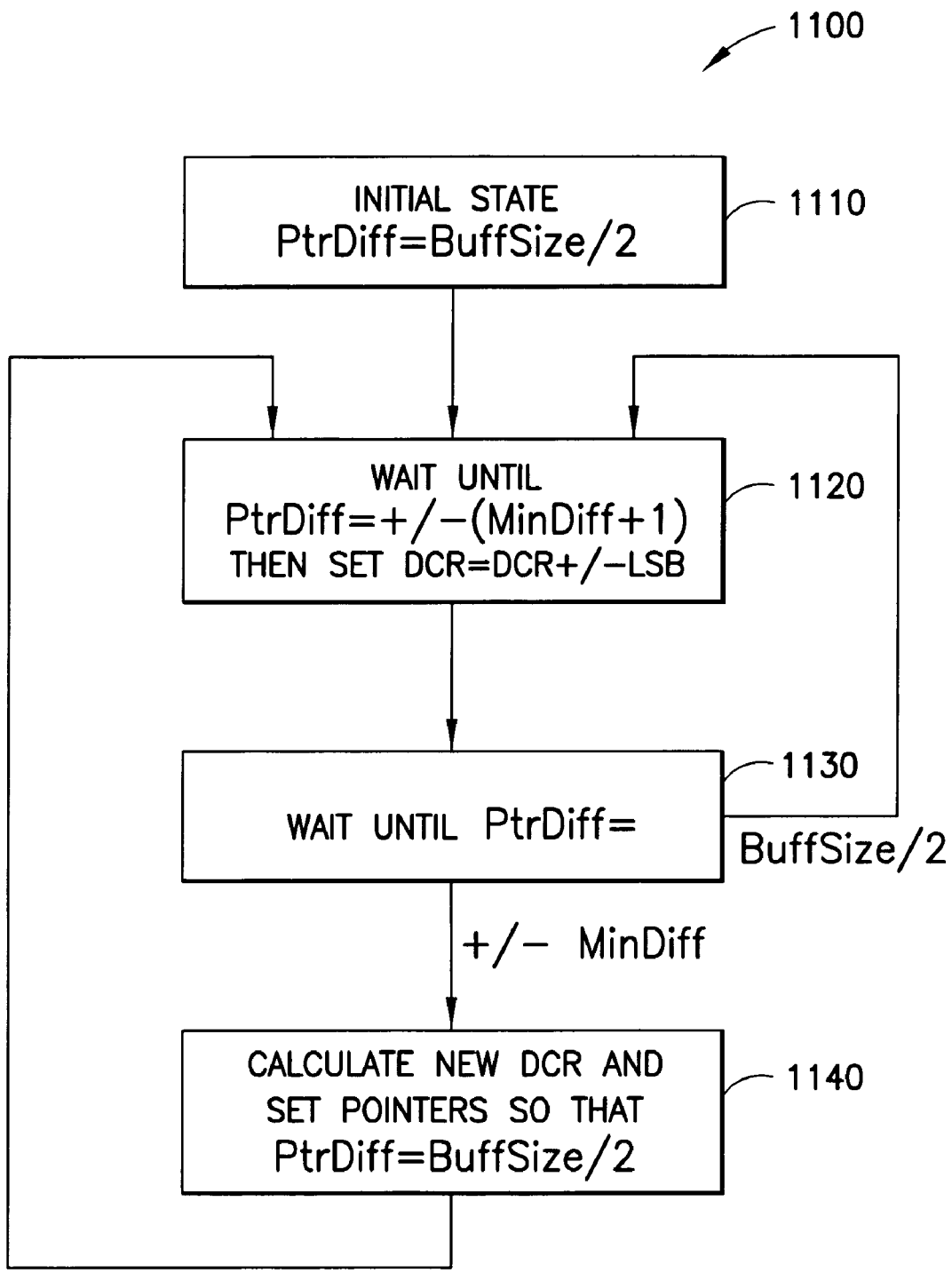
FIG. 10 is a flowchart of an exemplary method for decimation ratio tracking.

Referring now to FIG. 10, a method 1100 for decimation ratio tracking is shown including LSB correction. Method 1100 is performed, for instance, by the SRC control block 550 of FIG. 5. When reset (see reset 425 of FIG. 4) is released, tracking starts from initial state, in which the write pointer 540 and the read pointer 545 are set to respective initial positions as shown in FIG. 8. This occurs in step 1110. Additionally, the pointer difference, PtrDiff, is set to half the size of the memory 535, as BuffSize/2. If the decimation ratio 561 is not correct, the pointer difference starts to decrease. In a first phase, LSB correction is done once (step 1120) and if the LSB correction is enough, the pointer difference starts to recover. When pointer difference passes the initial value (step 1130=BuffSize/2), LSB correction (step 1120) is enabled again. The threshold value for LSB-correction can be other than MinDiff+1 used in FIG. 10. If LSB-correction is not enough (step 1130=+/−MinDiff), "phase" and "frequency" correction is performed is step 1140 and LSB correction (step 1120) is enabled again.

A correction factor, C, for decimation ratio 561 is calculated, in an exemplary embodiment, every time the pointers 540, 545 reach the set minimum value for the difference (MinDiff) of the pointers 540, 545. The write pointer 540 and read pointer 545 are reset to initial values (e.g., by having the SRC control block 550 use the control signal 580). Calculating the correction factor and resetting the pointers 540, 545 occurs in step 1140. A value for a new decimation ratio (DCRnew) is calculated using a previous value (DCRprev) and calculated correction factor:

$$DCRnew = C*DCRprev.$$

The correction factor can be calculated using the following ratio:

$$C = \frac{WrittenSamples + ErrorInPointerDifference}{WrittenSamples},$$

where ErrorinPointerDifference is defined by the number of excess or missing samples in FIFO 530 at a certain time point. When correction is performed, excess (or missing) samples are fixed by the number (BuffSize) of memory elements in the FIFO 530 and a minimum value for pointer difference (MinDiff). An additional counter (Rounds) is used for counting rotations of the write pointer 540 and used to calculate number of written samples:

$$C = 1 + \frac{0.5*BuffSize \pm MinDiff}{Rounds*BuffSize + WritePtr},$$

where, when excess samples are detected, a plus sign is used in the equation for C, and in case of missing samples, a minus sign is used in the equation for C.

Turning now to FIG. 11, FIG. 11 shows a possible graph of decimation ratio during tracking and error in pointer difference as might be experienced by a sample rate converter using the method of FIG. 10. Whenever frequency of the input clock signal 415 or output clock signal 435 (e.g., or both) is changed or the sample rate converter 420 is reset, there will be a tracking period 1210. In tracking period 1210, step 1140 of method 11 is typically performed multiple times to rapidly converge to the decimation ratio 561 that offers the least error in terms of the pointer difference. In the example of FIG. 11, step 1140 was performed three times. Once the decimation ratio 561 that offers the least error in terms of the pointer difference is found, then typically an LSB correction period 1220 will be entered. The LSB correction period 1220 operates using steps 1120 and 1130 of FIG. 10 and modifies the decimation ratio 561 around an optimum value.

Figure 12:
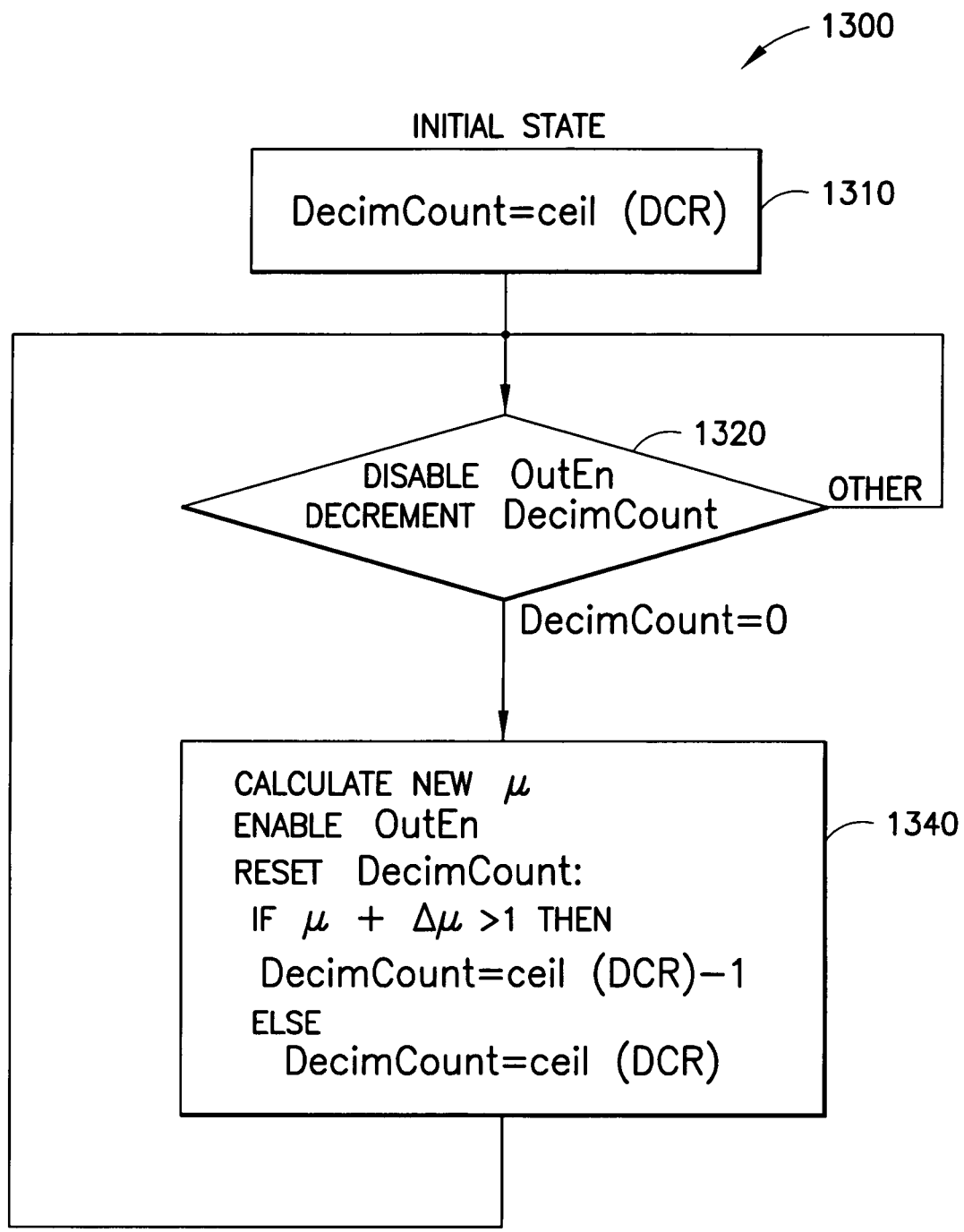
FIG. 12 is an exemplary method for determining when an enable signal, shown in FIGS. 5, 6, and 9, is enabled.

Turning now to FIG. 12, an exemplary method 1200 is shown for determining when an enable signal, OutEn, 525 (shown in FIGS. 5, 6, and 9) is enabled. As described above, the enable signal, OutEn, 525 is used to determine when the FIFO 530 (see FIG. 5) will latch in a new output sample. See also FIG. 9 above. In step 1310, a variable DecimCount is set to ceil(DCR). In step 1320, the enable signal, OutEn, 525 is disabled and DecimCount is decremented. If DecimCount is zero, step 1340 is performed; otherwise, step 1320 is performed again. In step 1340, a value for fractional delay information, μ, 570 is calculated, and the enable signal, OutEn, 525 is enabled. DecimCount is reset by setting DecimCount to be equal to (ceil(DCR)−1) if (μ+Δμ)>1, else DecimCount is reset by setting DecimCount to be equal to ceil(DCR).

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

Furthermore, some of the features of the preferred embodiments of this invention could be used to advantage without the corresponding use of other features. As such, the foregoing description should be considered as merely illustrative of the principles of the present invention, and not in limitation thereof.

What is claimed is:

1. A method for sample rate conversion between first samples having a sample rate defined by a first clock signal and second samples having a sample rate defined by a second clock signal, comprising:
   determining, using a conversion ratio and at a first rate defined by the first clock signal, a given second sample from at least one first sample;
   updating a write pointer for a buffer when second samples are written into the buffer;
   updating a read pointer for the buffer when second samples are read from the buffer, wherein the second samples are read from the buffer at a second rate defined by the second clock signal; and
   modifying the conversion ratio based on the write and read pointers.

2. The method of claim 1, wherein the conversion ratio defines a relationship between the first and second clock signals.

3. The method of claim 1, wherein:
   the method further comprises determining a difference between the write and read pointers; and
   modifying further comprises modifying the conversion ratio based on the difference between the write and read pointers.

4. The method of claim 3, wherein:
   determining further comprises determining, using fractional delay information determined using the conversion ratio and at a first rate defined by the first clock signal, the given second sample from at least one first sample; and
   modifying further comprises:
      determining, by using the difference between the write and read pointers, a correction factor;
      determining a new conversion ratio by multiplying a current conversion ratio by the correction factor; and
      determining updated fractional delay information using the new conversion ratio.

5. The method of claim 4, wherein determining a correction factor further comprises determining the correction factor, C, by using the following formula:

$$C = \frac{WrittenSamples + ErrorInPointerDifference}{WrittenSamples},$$

wherein WrittenSamples is a number of second samples written to the buffer, ErrorInPointerDifference is a change in pointer difference since a last reset of the write and read pointers, and ErrorInPointerDifference can be positive or negative.

6. The method of claim 4, wherein the buffer comprises a plurality of memory locations, wherein the memory locations comprise a circular buffer, wherein determining a correction factor further comprises determining the correction factor, C, by using the following formula:

$$C = 1 + \frac{0.5 * BuffSize \pm MinDiff}{Rounds * BuffSize + WritePtr},$$

wherein BuffSize is a number of memory locations in the memory, MinDiff is a minimum value for the difference, Rounds is a number indicating rotations of the write pointer around the circular buffer after a starting point, WritePtr is a value corresponding to the write pointer, when excess second samples are detected, a plus sign is used in the equation for C, and when missing second samples are detected a minus sign is used in the equation for C.

7. The method of claim 1, wherein modifying further comprises adjusting the conversion ratio by a least significant bit (LSB).

8. The method of claim 7, wherein adjusting the conversion ratio further comprises adjusting the conversion ratio by a LSB in response to a pointer difference, between the write and read pointers, being a minimum difference.

9. The method of claim 8, wherein adjusting the conversion ratio further comprises determining a new conversion ratio in response to the pointer difference being the minimum difference again after the conversion ratio was adjusted by the LSB.

10. The method of claim 9, wherein the method further comprises, in response to determining a new conversion ratio, setting the read pointer to a first initial value and the write pointer to a second initial value.

11. The method of claim 10, wherein the buffer comprises a plurality of memory locations, the memory locations comprising circular buffer, and wherein the first and second initial values are set to be as far apart as possible within the circular buffer.

12. The method of claim 1, wherein modifying further comprises determining a new conversion ratio based on the write and read pointers.

13. The method of claim 12, wherein:
   the buffer comprises a plurality of memory locations, the memory locations comprise a circular buffer; and
   the method further comprises, in response to determining a new conversion ratio, setting the read pointer to a first initial value and the write pointer to a second initial value, wherein the first and second initial values are set to be as far apart as possible within the circular buffer.

14. The method of claim 1, wherein:
   the conversion ratio is a decimation ratio (DCR);
   determining further comprises determining, using fractional delay information determined using the DCR and at a first rate defined by the first clock signal, the given second sample from at least one first sample; and
   modifying further comprises updating the DCR and modifying the fractional delay information using the updated DCR.

15. The method of claim 14, wherein the fractional delay information is $\mu$, and wherein modifying the fractional delay information using the DCR further comprises modifying the fractional delay information by using the following formula:

$$\Delta\mu = ceil(DCR) - DCR,$$

wherein ceil( ) is a function giving a smallest integer that is bigger than a given irrational number, and wherein $\Delta\mu$ is a change in fractional delay information from fraction delay information used in calculating preceding second samples and current fractional delay information.

16. A sample rate converter providing sample rate conversion between first samples having a sample rate defined by a first clock signal and second samples having a sample rate defined by a second clock signal, comprising:

a buffer;

an interpolator coupled to the buffer and to the first clock signal, the interpolator adapted to determine, using a conversion ratio and at a first rate defined by the first clock signal, a given second sample from at least one first sample;

first logic coupled to the buffer, the first logic adapted to update a write pointer when second samples are written into the buffer and adapted to update a read pointer when second samples are read from the buffer, wherein the second samples are read from the buffer at a second rate defined by the second clock signal; and second logic coupled to the first logic and the interpolator, the second logic responsive to the write and read pointers and adapted to modify the conversion ratio based on the write and read pointers.

17. The sample rate converter of claim 16, wherein the conversion ratio defines a relationship between the first and second clock signals.

18. The sample rate converter of claim 16, wherein the second logic is further adapted to determine a difference between the write and read pointers and to modify the conversion ratio based on the difference between the write and read pointers.

19. The sample rate converter of claim 18, wherein:

the interpolator is further adapted to determine, using fractional delay information determined using the conversion ratio and at a first rate defined by the first clock signal, the given second sample from at least one first sample; and the second logic is further adapted:
 to determine, by using the difference between the write and read pointers, a correction factor;
 to determine a new conversion ratio by multiplying a current conversion ratio by the correction factor; and
 to modify the fractional delay information using the new conversion ratio.

20. The sample rate converter of claim 19, wherein the second logic is further adapted to determine the correction factor by using the following formula:

$$C = \frac{WrittenSamples + ErrorInPointerDifference}{WrittenSamples},$$

wherein WrittenSamples is a number of second samples written to the buffer, ErrorInPointerDifference is a change in pointer difference since a last reset of the write and read pointers, and ErrorInPointerDifference can be positive or negative.

21. The sample rate converter of claim 19, wherein the buffer comprises a plurality of memory locations, wherein the memory locations comprise a circular buffer, wherein the second logic is further adapted to determine the correction factor by using the following formula:

$$C = 1 + \frac{0.5 * BuffSize \pm MinDiff}{Rounds * BuffSize + WritePtr},$$

wherein BuffSize is a number of memory locations in the memory, MinDiff is a minimum value for the difference, Rounds is a number indicating rotations of the write pointer around the circular buffer after a starting point, WritePtr is a value corresponding to the write pointer, and when excess second samples are detected, a plus sign is used in the equation for C, and when missing second samples are detected a minus sign is used in the equation for C.

22. The sample rate converter of claim 16, wherein the second logic is further adapted to adjust the conversion ratio by a least significant bit (LSB).

23. The sample rate converter of claim 22, wherein the second logic is further adapted to adjust the conversion ratio by a LSB in response to a pointer difference, between the write and read pointers, being a minimum difference.

24. The sample rate converter of claim 23, wherein the second logic is further adapted to determine a new conversion ratio in response to the pointer difference being the minimum difference again after the conversion ratio was adjusted by the LSB.

25. The sample rate converter of claim 24, wherein the first and second logic cooperate, in response to determining a new conversion ratio, to set the read pointer to a first initial value and the write pointer to a second initial value.

26. The sample rate converter of claim 25, wherein the buffer comprises a plurality of memory locations, the memory locations comprising a circular buffer, and wherein first and second logic cooperate to set the first and second initial values as far apart as possible within the circular buffer.

27. The sample rate converter of claim 16, wherein the second logic is further adapted to determine a new conversion ratio based on the write and read pointers.

28. The sample rate converter of claim 27, wherein:
 the buffer comprises a plurality of memory locations, the memory locations comprise a circular buffer; and
 the first and second logic cooperate, in response to determining a new conversion ratio, to set the read pointer to a first initial value and the write pointer to a second initial value, wherein the first and second initial values are set to be as far apart as possible within the circular buffer.

29. The sample rate converter of claim 16, wherein:
 the conversion ratio is a decimation ratio (DCR);
 the interpolator is further adapted to determine, using fractional delay information determined using the conversion ratio and at a first rate defined by the first clock signal, the given second sample from at least one first sample; and
 the second logic is further adapted:
  to update the DCR; and
  to modify the fractional delay information using the DCR.

30. The sample rate converter of claim 29, wherein the fractional delay information is μ, and wherein the second logic is further adapted to modify the fractional delay information by using the following formula:

Δμ=ceil(DCR)−DCR, wherein ceil( ) is a function giving a smallest integer that is bigger than a given irrational number, and Δμ is a change in fractional delay information from fractional delay information used in calculating preceding second samples and current fractional delay information.

31. A mobile station comprising:
 a front end operating using a first clock signal;
 a back end operating using a second clock signal; and
 a sample rate converter coupling the front and back ends, the sample rate converter providing sample rate conversion between first samples having a sample rate defined by the first clock signal and second samples having a sample rate defined by the second clock signal, the sample rate converter comprising:

a buffer;

an interpolator coupled to the buffer and to the first clock, the interpolator adapted to determine, using a conversion ratio and at a first rate defined by the first clock signal, a given second sample from at least one first sample;

first logic coupled to the buffer, the first logic adapted to update a write pointer when second samples are written into the buffer and adapted to update a read pointer when second samples are read from the buffer, wherein the second samples are read from the buffer at a second rate defined by the second clock signal; and second logic coupled to the first logic and the interpolator, the second logic responsive to the write and read pointers and adapted to modify the conversion ratio based on the write and read pointers.

32. A program product embodied on a recordable medium, the program product for sample rate conversion between first samples having a sample rate defined by a first clock signal and second samples having a sample rate defined by a second clock signal, the program product comprising one or more programs that perform the following steps:

determining, using a conversion ratio and at a first rate defined by the first clock signal, a given second sample from at least one first sample;

updating a write pointer for a buffer when second samples are written into the buffer;

updating a read pointer for the buffer when second samples are read from the buffer, wherein the second samples are read from the buffer at a second rate defined by the second clock signal; and modifying the conversion ratio based on the write and read pointers.

33. An apparatus for sample rate conversion between first samples having a sample rate defined by a first clock signal and second samples having a sample rate defined by a second clock signal, comprising:

means for determining, using a conversion ratio and at a first rate defined by the first clock signal, a given second sample from at least one first sample;

means for updating a write pointer for a buffer when second samples are written into the buffer;

means for updating a read pointer for the buffer when second samples are read from the buffer, wherein the second samples are read from the buffer at a second rate defined by the second clock signal; and means for modifying the conversion ratio based on the write and read pointers.

34. A method for sample rate conversion between first samples having a sample rate defined by a first clock signal and second samples having a sample rate defined by a second clock signal, comprising:

determining, using a conversion ratio and at a first rate defined by the first clock signal, a given second sample from at least one first sample;

writing the given second sample to a buffer;

reading, at a second rate defined by the second clock signal, one of the given second samples from the buffer;

performing the steps of determining, writing, and reading for a time period;

determining how many given second samples were written into and read from the buffer in the time period; and updating, if necessary, the conversion ratio based on an amount of error between how many given second samples were written into and read from the buffer in the time period.

35. The method of claim 34, wherein updating further comprises updating the conversion ratio in response to a number of given second samples that were written into the buffer being not equal to the number of given second samples read from the buffer.

* * * * *